(12) United States Patent
Engquist

(10) Patent No.: US 6,888,361 B1
(45) Date of Patent: May 3, 2005

(54) HIGH DENSITY LOGIC ANALYZER PROBING SYSTEM

(75) Inventor: David T. Engquist, Portland, OR (US)

(73) Assignee: Tektronix, Inc., Beaverton, OH (US)

( * ) Notice: Subject to any disclaimer, the term of this patent is extended or adjusted under 35 U.S.C. 154(b) by 0 days.

(21) Appl. No.: 10/856,373

(22) Filed: May 27, 2004

Related U.S. Application Data

(60) Provisional application No. 60/553,593, filed on Mar. 12, 2004.

(51) Int. Cl.[7] .............................................. G01R 31/02
(52) U.S. Cl. ...................................... 324/755; 324/754
(58) Field of Search ................................ 324/755, 754, 324/765, 158.1, 761, 762, 72.5; 439/289, 638

(56) References Cited

U.S. PATENT DOCUMENTS

| | | | |
|---|---|---|---|
| 6,007,357 A | * 12/1999 | Perino et al. ................ | 439/327 |
| 6,343,957 B1 | * 2/2002 | Kuo et al. ................... | 439/638 |
| 6,447,339 B1 | 9/2002 | Reed et al. | |
| 6,781,391 B2 | * 8/2004 | Reed et al. .................. | 324/754 |
| 6,822,466 B1 | * 11/2004 | Holcombe et al. .......... | 324/761 |

OTHER PUBLICATIONS

"Agilent Technologies Soft Touch Connectorless Probes"—User's Guide, Agilent Technologies, Inc. 2002–2004, 78 Pages.

"Tektronix TMS817 and TMS818 PCIExpress Buss Supports 071–1214–00"—Instruction Manual, Copyright Tektronix, Inc., 65 Pages.

* cited by examiner

Primary Examiner—David Zarneke
Assistant Examiner—Tung X. Nguyen
(74) Attorney, Agent, or Firm—William K. Bucher

(57) ABSTRACT

A high density logic analyzer probing system has a probe mounting fixture for accurately positioning mounting posts to a device under test (DUT). The mounting posts includes a recess in one side for receiving a spring wire clip that mounts through holes in the DUT. The housing includes protrusions that receive screws for securing the probe head to the mounting posts on the DUT. The screws have a first shoulder that engages the protrusions and a second shoulder that engages the mounting post. The probe head is positioned between the mounting posts and tightened to the DUT using the screws. The first shoulder applies downward pressure on the probe head and the second shoulder provides a positive stop to prevent over tightening of the probe head which can cause damage to probe contacts in the probe head.

3 Claims, 6 Drawing Sheets

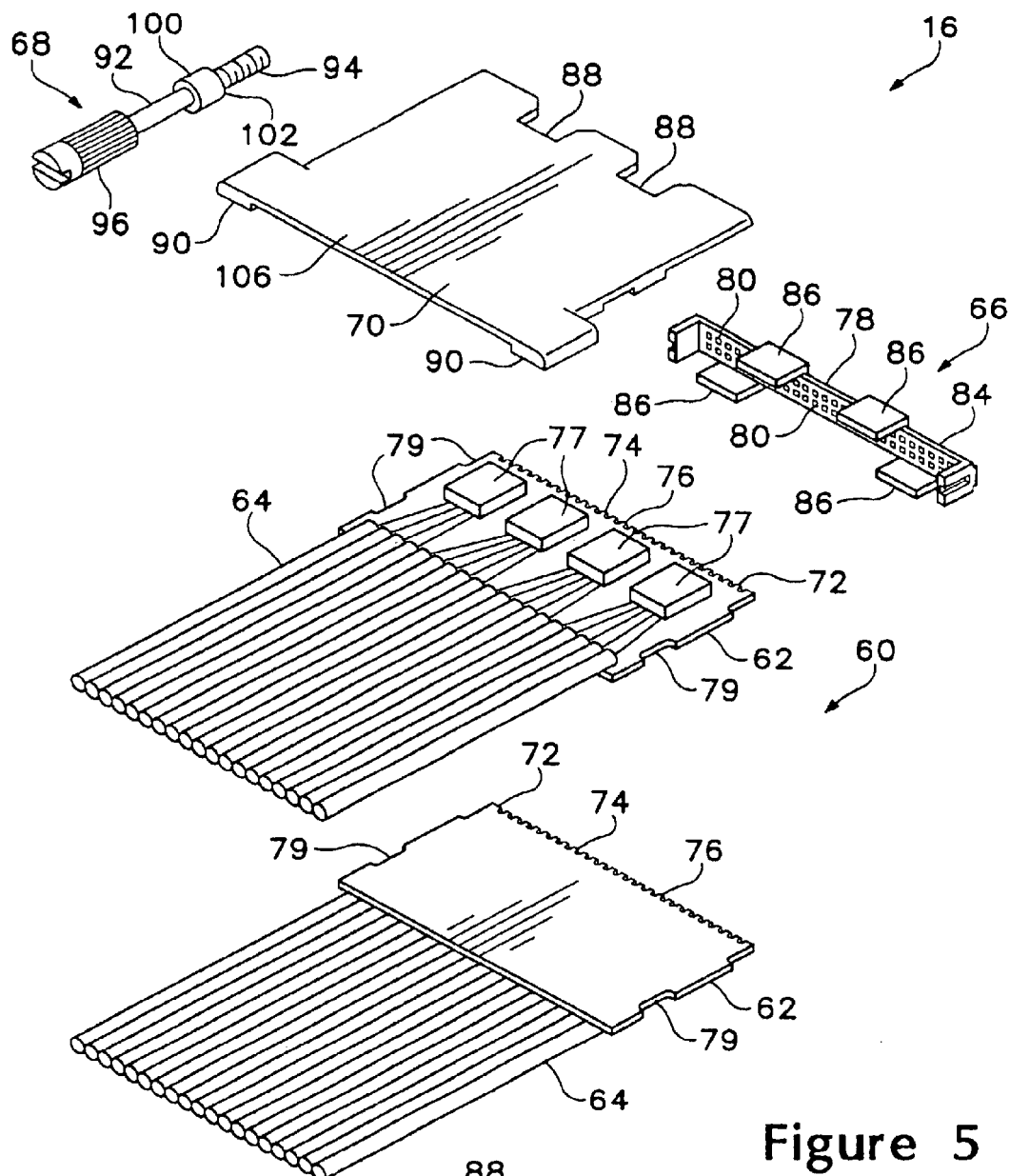
Figure 5
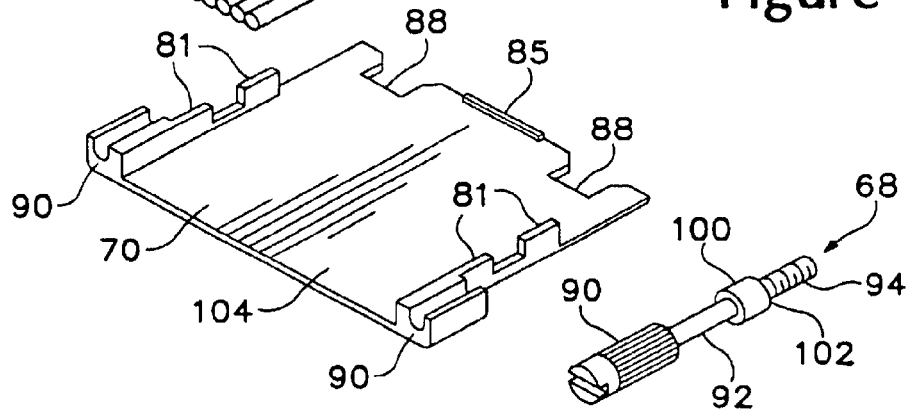

HIGH DENSITY LOGIC ANALYZER PROBING SYSTEM

CROSS-REFERENCE TO RELATED APPLICATION

This application claims the benefit of the U.S. Provisional Application No. 60/553,593, filed Mar. 12, 2004.

BACKGROUND OF THE INVENTION

The present invention related generally to logic analyzer probes and more particularly to a high density logic analyzer probing system for mounting logic analyzer probes to a device under test.

Logic analyzer probes are used for acquiring multiple signals from probing points, circuit traces, processor buses and the like on a device under test (DUT). Probing points may take the form of square pin connectors mounted on the DUT that are connected to circuit elements or circuit traces. Various types of high, speed, controlled impedance connectors may also be mounted on the DUT for coupling multiple high speed signals to the logic analyzer. One such connector is called a MICTOR® connector, manufactured and sold by Tyco Electronics, Corp., Harrisburg, Pa. A MICTOR® connector has a plug and closely mating receptacle. The transmission lines in the plug and receptacle are contained in mating housings. The ends of the transmission lines extending from the bottom of the receptacle are bent at an angle to form contact pads for soldering to parallel rows of conductive pads on the surface of a circuit board DUT. The ends of the transmission lines at the other end of the receptacle form electrical contacts that mate with corresponding electrical contacts in the plug when the closely mating plug and receptacle are connected together. In most probing applications of microprocessor boards, multiple MICTOR receptacles are mounted on the circuit board. The mating MICTOR plugs are mounted on multi-channel logic analyzer probe heads. The transmission lines of the MICTOR plug are electrically coupled to center conductors of a multiple coaxial cable type ribbon cable. Electrical elements, such as resistors, may be inserted between the MICTOR plug and the coaxial cables to provide electrical isolation for the device under test. One drawback to the use of MICTOR connectors is the amount of space the connectors take up on the DUT.

To reduce the amount of space take up by MICTOR connector and other such connectors, connectorless logic analyzer probes were developed. The connectorless logic analyzer probe mounts directly to the electrical contacts pads on the DUT and does not require the use of MICTOR connectors. One such connectorless logic analyzer probe is the P6860 Logic Analyzer Probe, manufactured and sold by Tektronix, Inc, Beaverton Oreg. and described in U.S. Pat. No. 6,447,339. The P6860 probe has a non-conductive plastic-type housing in which are secured substrates having electrical contacts formed on the one of the substrate ends and exposed at one end of the housing. The electrical contacts are electrically coupled to passive and active circuitry on the substrates. A removable signal contact holder is mounted over the open end of the housing. The removable signal contact holder has parallel rows of elastomeric contacts that correspond to the electrical contacts on the ends of the substrates. The probe is positioned on the DUT with the elastomeric contacts engaging a corresponding pattern of electrical contact pads on the DUT. The housing has attachment screws mounted on the sides of the housing that engage a retention block. The retention block has a stiffener member enclosed in a housing having alignment flanges that extend though holes in the DUT adjacent to the electrical contact pads on the DUT. The retention block is positioned on the reverse side of the DUT under the electrical contacts. The retention block flanges engage features on the housing to align the elastomeric contacts of the probe with the electrical contact pads on the DUT. The screws are tightened into the retention block to secure the probe to the DUT. The P6860 is designed for electrical contact pad patterns on the DUT of 85 contacts per square inch.

Another type of connectorless logic analyzer probe are PCIExpress Bus probes, manufactured and sold by Tektronix, Inc. The PCIExpress Bus probes have machined mounting posts that are positioned adjacent to the parallel rows of electrical contact pads on the DUT. The mounting posts have a base with apertures formed therein that receive mounting pins. The mounting pins extend into holes formed in the DUT adjacent to the electrical contact pads. The mounting pins are soldered to the DUT to secure the mounting post to the DUT. The mounting posts have upwardly extending studs with threaded apertures formed therein. An interconnect strip is positioned between the mounting posts. The interconnect strip have electrical contacts, such as a cLGA c-clip, manufactured and sold by InterCon Systems, Inc., Harrisburg, Pa., that correspond to the pattern of electrical contact pads on the DUT. The PCIExpress Bus probes has an open housing structure with substrates mounted on either side of a central support member. The substrates have electrical contacts formed on the one of its end surfaces that are exposed at the bottom of the housing. Side members attached to the central support member secure the substrates in the housing. Each side member has a central bore that receives a screw for securing the housing to the mounting posts. The probe is positioned between the mounting posts with the electrical contacts on the substrates engaging corresponding electrical contacts in the interconnect strip. The housing screws are tightened to secure the probe to the DUT. The PCIExpress Bus probe is designed for electrical contact pad patterns on the DUT of 130 contacts per square inch.

A drawback to the above described connectorless probes is the possibility of over tightening the probe heads to the DUT. In the case of the P6860 Logic Analyzer Probe, over tightening can cause the fine wires in the elastomeric connectors to take a permanent set causing the intermittent connections between the substrate contacts and the contact pads on the DUT. Further, the substrates may be forced into the soft plastic of the removable signal contact holder which may cause damage to the substrates themselves. In the case of the PCIExpress Bus probes, over tightening can cause damage to the electrical contacts in the interconnect clip. Further, the interconnect strip is separate from the probe head and not retained in the probe head as is the case with the P6860 probe.

Another type of connectorless probe are the E5387A, E5390A and the E5394A soft touch probes manufactured and sold by Agilent Technologies Inc., Palo Alto, Calif. The soft touch probes have a plastic retention module having downwardly facing metallic studs that are mounted into holes formed adjacent to the parallel rows of electrical contact pads on the DUT. The metallic studs are soldered to the DUT to secure the retention module to the DUT with the retention modules extending completely around the periphery of the parallel rows of electrical contact pads. The soft touch probe head has a plastic housing in which are secured parallel substrates. One end of each substrate has micro spring-pin electrical contacts that mate with the parallel rows of the electrical contact pads on the DUT. The micro spring-pin electrical contacts are coupled to wires of electrical ribbon cables extending from the other end of the housing via passive circuit elements. Mounting screws extend down opposing sides of the housing and are screwed into threaded apertures in the retention module. The soft touch probes are designed for electrical contact pad patterns on the DUT of 128 contacts per square inch.

A drawback to the soft touch probes is the use of the retention module which surrounds the electrical contact pad pattern on the DUT. The retention module requires more board space than is required with the PCIExpress Bus probe and further requires greater separation between adjacent contact pad patterns. Additionally, the micro spring-pin electrical contacts are mounted to the substrates and require the probes to be sent to a service center for repair if a micro spring-pin contact is broken.

There is a continuing customer need to increase the higher density electrical contact patterns on DUTs. As the contact density increases per square inch there is a corresponding decrease in the separation between adjacent electrical contacts. This requires greater precision in placing the logic analyzer probes on the DUT. What is needed is a high density logic analyzer probing system that accurately positions a probe mounting fixture on a device under test for accurately positioning a high density logic analyzer probe to the device under test. The high density logic analyzer probing system should also provide a positive stop that prevents damage to electrical contacts on the high density logic analyzer probe. Further, the high density logic analyzer probing system should be adaptable for use with various thicknesses of circuit boards and allow for placing the high density logic analyzer probes opposite of each other on opposing sides of the circuit board.

SUMMARY OF THE INVENTION

Accordingly, the present invention is a high density logic analyzer probing system for a device under test having a removable probe mounting fixture, a probe mounting system and at least a first high density logic analyzer probe. The removable probe mounting fixture has a handle and a mounting post alignment portion that receives the probe mounting system. The probe mounting system has mounting posts with threaded apertures formed in the top surfaces and positioned adjacent to the ends of the mounting post alignment portions. An alignment stud is extends from the bottom surface of one of the mounting posts form that engages an alignment hole on the device under test. The mounting posts are held in place by downwardly extending studs in the handle portion engaging the threaded apertures in the mounting posts. The mounting post are secured to a device under test by mounting post securing members engaging the mounting posts. The mounting post securing members are preferably spring wire clips with each spring wire clip having a central portion and end portions. The central portion of each wire clip disposed in a recess formed in a side surface of each mounting, post with the end portions of each spring wire clip extending below the mounting posts. The end portions of the spring wire clips are positioned through and secured in mounting holes in the device under test. The removable probe mounting fixture is removed from the mounting posts allowing the mounting post to accept a probe head. The probe head has electrically conductive contacts disposed at one end of a housing engaging electrically conductive contacts on the device under test. The housing has laterally extending protrusions formed on the opposite end of the housing for receiving mounting screws. Each mounting screw has a shaft and a threaded portion at one end and a integrally form cap at the other end. The cap forms a first shoulder on the shaft and a boss disposed between the threaded portion and the cap has a second shoulder. The threaded portions of the screws engage the respective threaded apertures of the mounting posts with the first shoulder providing downward force on the probe against the device under test as the screws are tightened in the mounting posts. The second shoulder provides a positive stop for the probe head as the screws are tightened to prevent excess force between the probe head and the device under test.

The high density logic analyzer probing system of the present invention may also be configured to provide for "sandwich probing" where two probes are mounted on opposite sides of device under test and mated with parallel rows of electrically conductive contacts that are vertically aligned with each other on opposite sides of the device under test. In such a configuration, modified mounting posts are positioned on the opposing surface of the device under test with each modified mounting post having a threaded aperture formed in a top surface. A lateral slot is formed in a side surface of the modified mounting posts that intersects vertical slots formed in adjacent side surfaces. The lateral slot receives a spring wire clip retention member having end portions separated by a central portion. Each end portion has an aperture formed therein. The end portions of the spring wire clips from the mounting posts on the other surface of the device under test extend along the vertical slots in the modified mounting posts and through the apertures in the end portions of the spring wire clip retention members. The end portions of the spring wire clips are secured to the end portions of the spring wire clip retention members to secure the modifies mounting posts to the device under test.

The objects, advantages and novel features of the present invention are apparent from the following detailed description when read in conjunction with appended claims and attached drawings.

BRIEF DESCRIPTION OF THE DRAWINGS

FIG. 5 is an exploded perspective view of the probing head of the high density logic analyzer probing system according to the present invention.

DESCRIPTION OF THE PREFERRED EMBODIMENT

Figure 1:
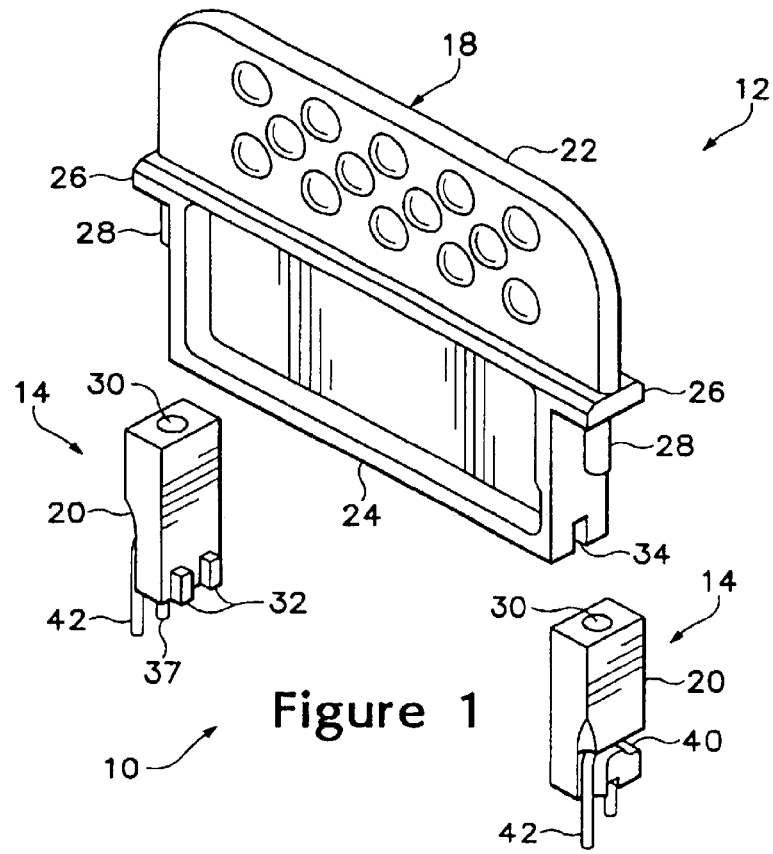
FIG. 1 is a perspective view of the probe mounting fixture and mounting posts of the high density logic analyzer probing system according to the present invention.

Referring to FIG. 1, there is shown a probe mounting fixture 10 as part of the high density logic analyzer probing system 12 of the present invention. The probing system 12 includes the probe mounting fixture 10, a probe mounting system 14 and at least a first high density logic analyzer probe 16. The probe mounting fixture 10 has a carrier 18 on which are positioned two mounting posts 20. The carrier 18 has a handle portion 22 disposed adjacent to a mounting post alignment portion 24. The handle portion 22 has protrusions 26 that extend laterally on both sides past the mounting post alignment portion 24. Each protrusion 26 has a downwardly extending stud 28 that is closely received in a threaded aperture 30 formed in the top of each mounting post 20. The mounting post alignment portion 24 may be formed with one or more ribs or grooves 32 that mate with corresponding ribs or grooves 34 formed on one side of the mounting posts 20 for positioning a particular post on one side or the other of the mounting post alignment portion 24. Preferably, one side of the mounting post alignment portion 24 has a single rib or groove and the other side has two ribs or grooves. The width of the mounting post alignment portion 24 is controlled to allow accurate alignment of the mounting posts 20 with a matching land pattern 36 on a device under test (DUT) 38, such as a circuit board or the like. The posts 20 are formed of a substantially hard and durable material, preferably a metal such as aluminum. A downwardly extending stud 37 is formed on the bottom surface of one of the mounting posts 20 for alignment purposes. Each post 20 has a recess 40 formed in one side for accepting a spring wire clip 42, preferably formed of beryllium-copper. A variety of spring wire clips 42, differing in length, may be used with the mounting posts 20 for installation on circuit boards 38 having various thicknesses.

Figure 2:
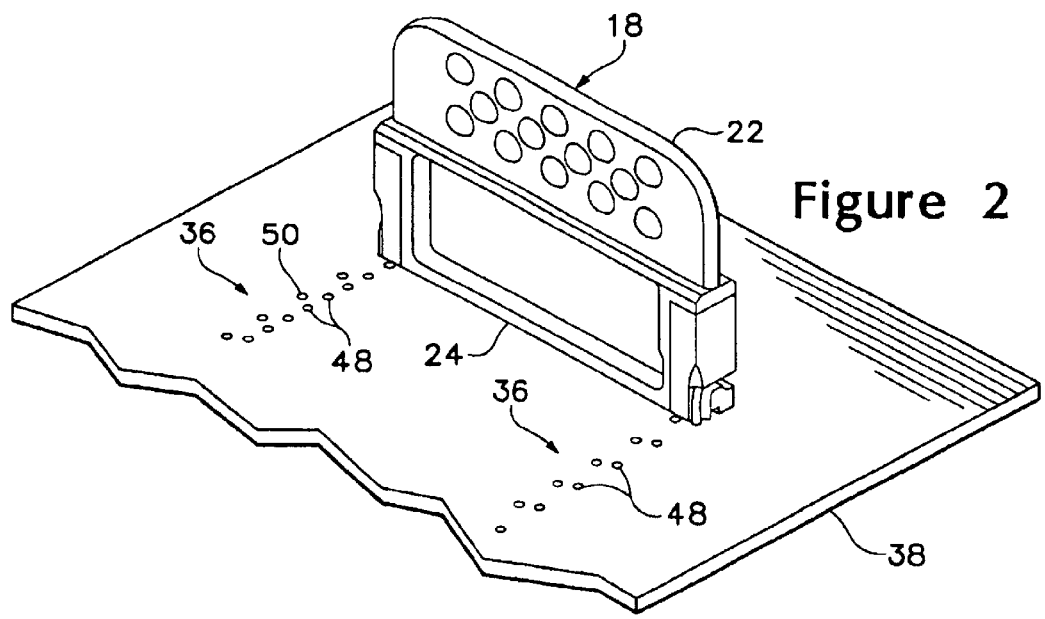
FIG. 2 is a perspective view of the probe mounting fixture and mounting posts positioned on a DUT.
Figure 3:
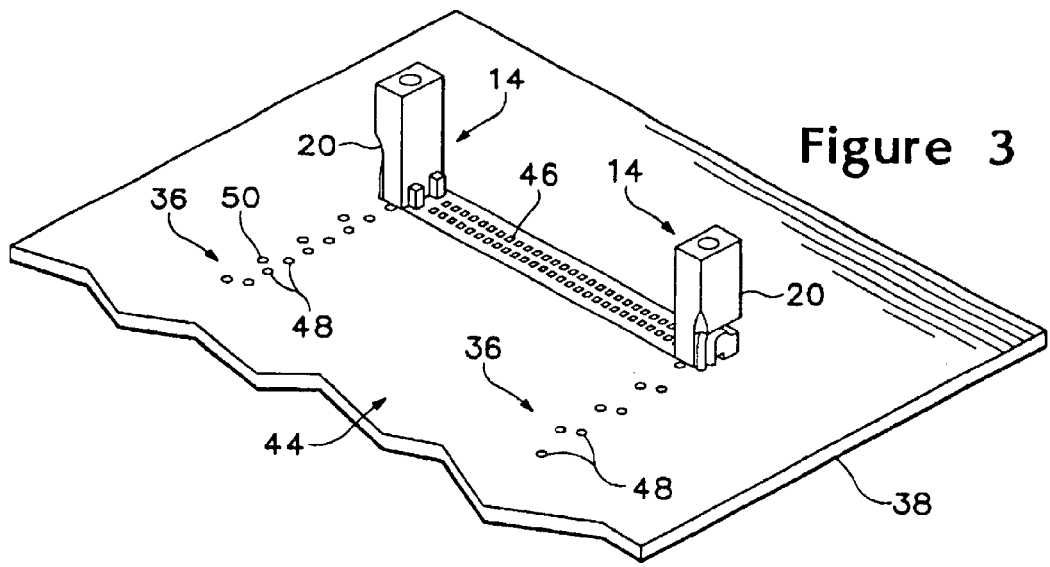
FIG. 3 is a perspective view of the mounting posts secured to the DUT.

The probe mounting fixture 10 with the mounting posts 20 is installed on the DUT 38 as shown in FIG. 2. The DUT 38 has a land pattern 44 that includes parallel rows of electrically conductive contacts 46 (see FIG. 3) and the land pattern 36 for the mounting posts 20. The electrical contact pad pattern on the DUT has a substantially higher pad density of 217 contacts per square inch. The mounting post land pattern 36 has four mounting holes 48 and one unplated keying hole 50 for properly orienting and accurately aligning of the mounting system 14. The wire clip leads 42 pass through the mounting holes 48 while at the same time the stud 37 on the bottom of one of the mounting posts 20 passes into the keying hole 50. The wire clip leads 42 are soldered down to the DUT 38. The excess lengths of the wire clip leads 42 are preferably bent over so they are substantially parallel to the bottom surface of the DUT 38 to prevent the mounting posts 20 from pulling out of the mounting holes 48 due to solder creep from pressure exerted by the logic analyzer probe 16 secured to the mounting posts 20. When forces are applied to the logic analyzer probe 16, the load will be supported by the bent leads of the wire clips 42 against the DUT 38 rather than the solder. The carrier 18 is then removed as shown in FIG. 3 and the probe mounting system 14 consisting of the mounting posts 20 is ready for the logic analyzer probe 16 installation.

Figure 4:
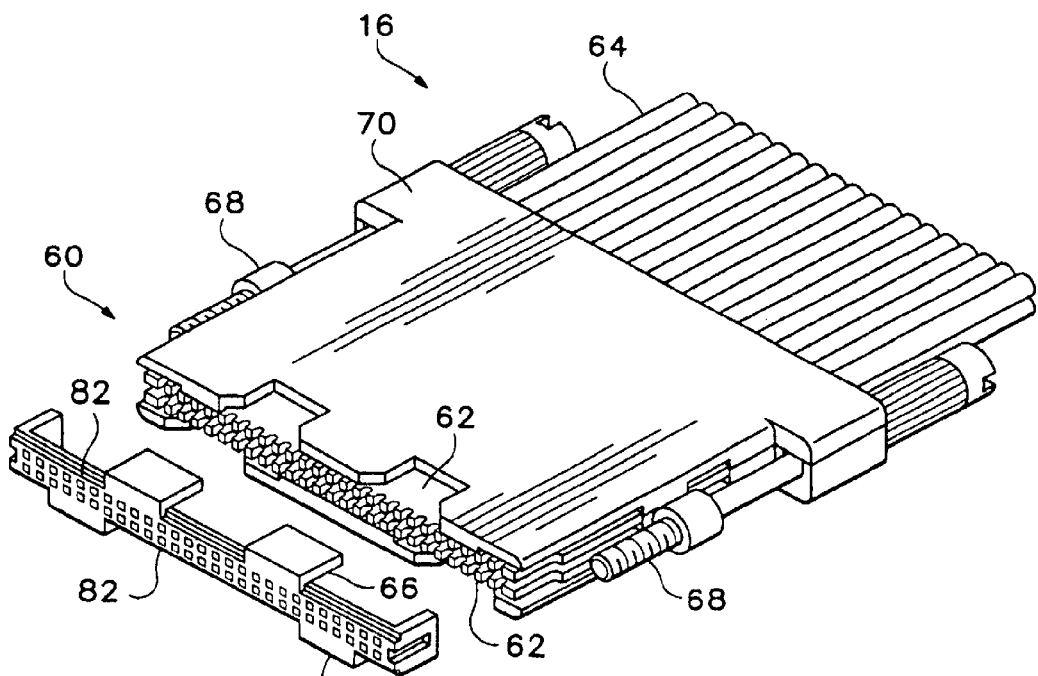
FIG. 4 is a perspective view of the probing head of the high density logic analyzer probing system according to the present invention.

Referring to FIGS. 4 and 5, the logic analyzer probe 16 has a probe head 60 consists of at least one active multi-chip module (MCM) 62, a shielded coaxial ribbon cable 64 electrically coupled to the MCM 62, an interface clip 66, two mounting screws 68, and a housing 70. In the preferred embodiment the probe head 60 has two MCM modules 62 and corresponding shielded coaxial ribbon cables 64. Each MCM module 62 is formed with a circuit board 72 made from a material such as FR4, TEFLON @ or the like, having one serrated edge 74 with the protrusions 76 of the serrated edge 74 being plated. Each plated protrusion 76 is coupled to active circuitry 77 mounted on the one side of the circuit board 72. The outputs of the active circuitry are coupled to respective coaxial cables of the coaxial ribbon cable 64. The MCM modules 62 are formed with side notches 79 that receive mating protrusions 81 of the housing 70. The interface clip 66 has a substantially rectangular base 78 with two parallel rows of apertures 80 aligned with the long side of the rectangular base 78. Each aperture 80 receives an electrically conductive contact 82, such as a cLGA® c-clip, manufactured and sold by InterCon Systems, Inc., Harrisburg, Pa. The electrically conductive contacts 82 provide a low capacitance electrical connection from the MCMs 62 to the electrically conductive contacts 46 of the land pattern 44 on the DUT 38. Other types of low capacitance electrical contacts 82, such as electrically conductive elastomer may be used. Each of the long sides of the interface clip 66 is formed with an undercut 84 that mates with corresponding ribs 85 formed in the housing 70. The interface clip 66 has upward extending protrusions 86 that mate with corresponding notches 88 formed in the housing 70. The interface clip 66 is replaceable in case the electrically conductive contacts 82 of the clip 66 are damaged. In the preferred embodiment, the mounting posts 20 and the screws 68 are color coded to provide a visual key to help the user orient the logic analyzer probe 16 correctly during installation. A physical key between the interface clip 66 and the mounting system posts 20 also aids this orientation. Another physical key between the interface clip 66 and the housing 70 assures proper orientation of the interface clip 66.

The housing 70 has opposing laterally extending protrusions 90 at one end that receive the mounting screws 68. Each mounting screw 68 has a shaft 92 with a threaded portion 94 at one end and an integrally formed knurled cap 96 at the other end. The knurled cap 96 forms a first shoulder 98 with the shaft. The top of the cap 96 may be provided with slot or formed depression for receiving a securing bit, such as a screwdriver bit or the like. Disposed between the cap end and the threaded end of the mounting screw is a boss 100 forming a second shoulder 102 with the shaft 92. In the preferred embodiment, the screws 68 are made of stainless steel.

The housing 70 is preferably formed of two plastic injection molded case-halves 104, 106. One of the molded case halves 104 has a base 108 and extending sidewalls 110 on opposing sides of the base. The sidewalls 110 are notched to form the upwardly extending protrusions 81 that mate with the notches 79 formed in the MCM modules. One end of the case half 104 includes the laterally extending protrusions 90 that has a thickness matching the thickness of the sidewalls 110. The laterally extending protrusions 90 in the case half 104 has a concave channel 112 formed parallel to the sidewalls 110 and perpendicular to the ends of the case half. The other end of the base includes the rib formed inner surface of the housing that mates with the one side of the undercut 94 in the interface clip 66 and the notches 88 that mate with the upwardly extending protrusions 86 on one side of the interface clip. The other case half 106 has a periphery 114 coextensive with the shape of the first case half 104 and is secured to the first case half to capture the MCM modules 62 within a cavity formed by the two case halves 104,106. The screws 68 are captured within 112 the channels 112 the laterally extending protrusions 90. The case halves 104,106 are secured together via any number of fastening means, such as screws, adhesives, such as epoxy or the like, sonic welding or the like. In the preferred embodiment, the case halves 104, 106 are sonic welded.

Alternately, each case half 104, 106 may be formed with notched sidewalls 110 and laterally extending protrusions 90 with each protrusion having a concave channel 112. The case halves 104, 106 are mated together at the notched sidewalls 110 and the laterally extending protrusions 90 and secured together.

The MCM modules 62 are positioned together back-to-back with the active components 77 facing outward. The MCM modules 62 are positioned in the case half 104 with the sidewalls with the upwardly facing protrusions 81 of the sidewalls 110 mating with the side notches 79 in the MCM modules 62. The coaxial ribbon cables 64 connected to the MCM modules 62 extend outward from the end of the case half 104, 106 with the laterally extending protrusions 90. The upper shaft portions 92 of the screws 68 between the cap 96 and the boss 100 are positioned in the concave channels 112 of the laterally extending protrusions 90. The other case half 106 is positioned on the first case half 104 with the laterally extending protrusions 90 of the first case half 104 aligned with the laterally extending protrusions 90 of the other case half 106 and the sidewalls 110 of the first case half 104 aligned with the side periphery 114 of the second case half 106. The case halves 104, 106 are secured together forming the cavity in which the MCM modules 62 are secured with the serrated edge 76 of each MCM module 62 being exposed at the opposing open end 116 of the housing 70 from the end having the laterally extending protrusions 90. The screws 68 are secured in the laterally extending protrusions 90 of the case halves 104, 106.

Figure 6:
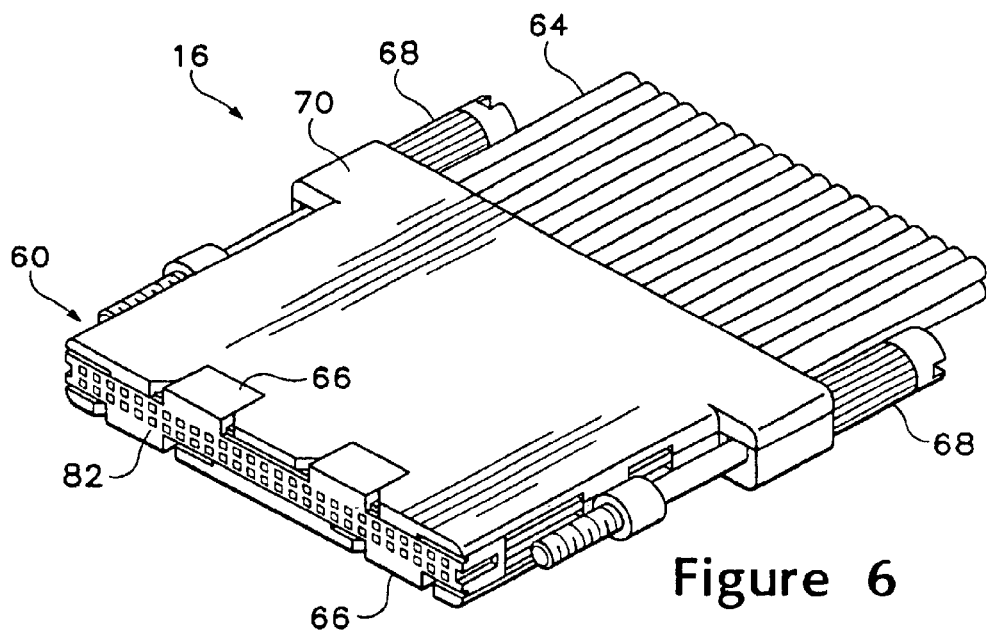
FIG. 6 is a perspective view of the assembled probe head of the high density logic analyzer probing system according to the present invention.
Figure 8:
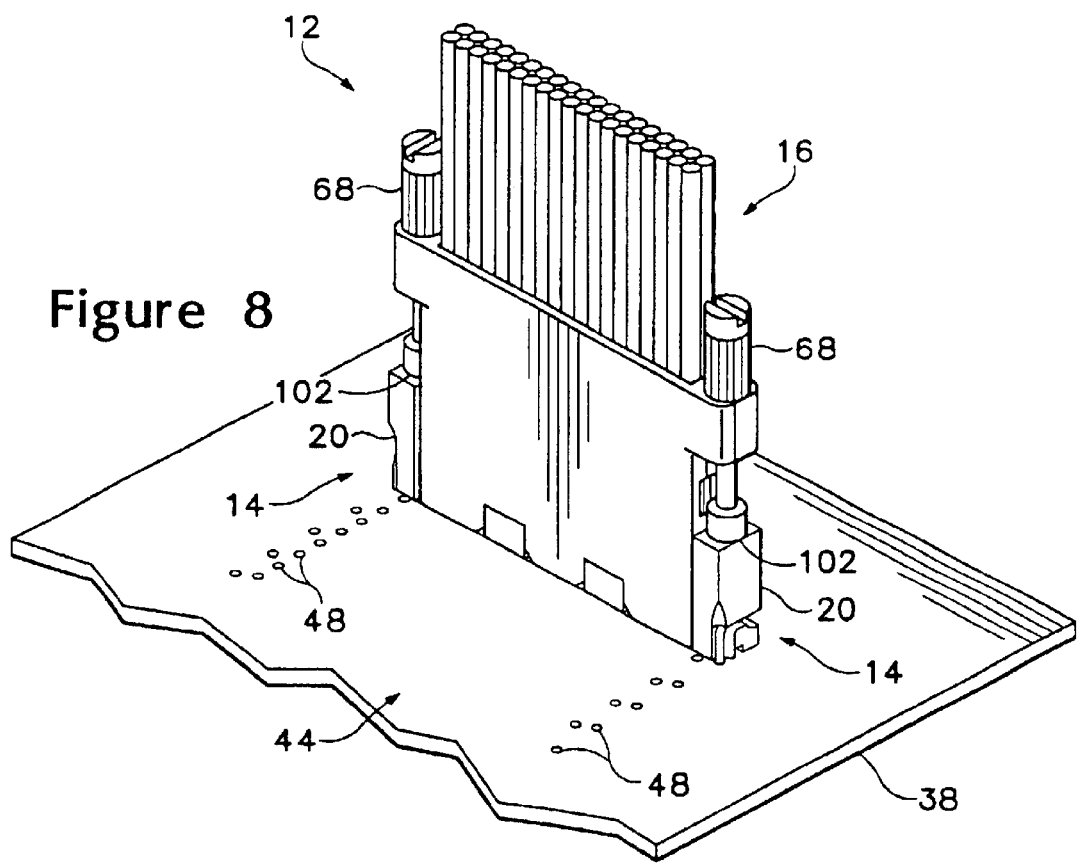
FIG. 8 is a perspective view of the probing head mounted on the DUT of the high density logic analyzer probing system according to the present invention.
Figure 7:
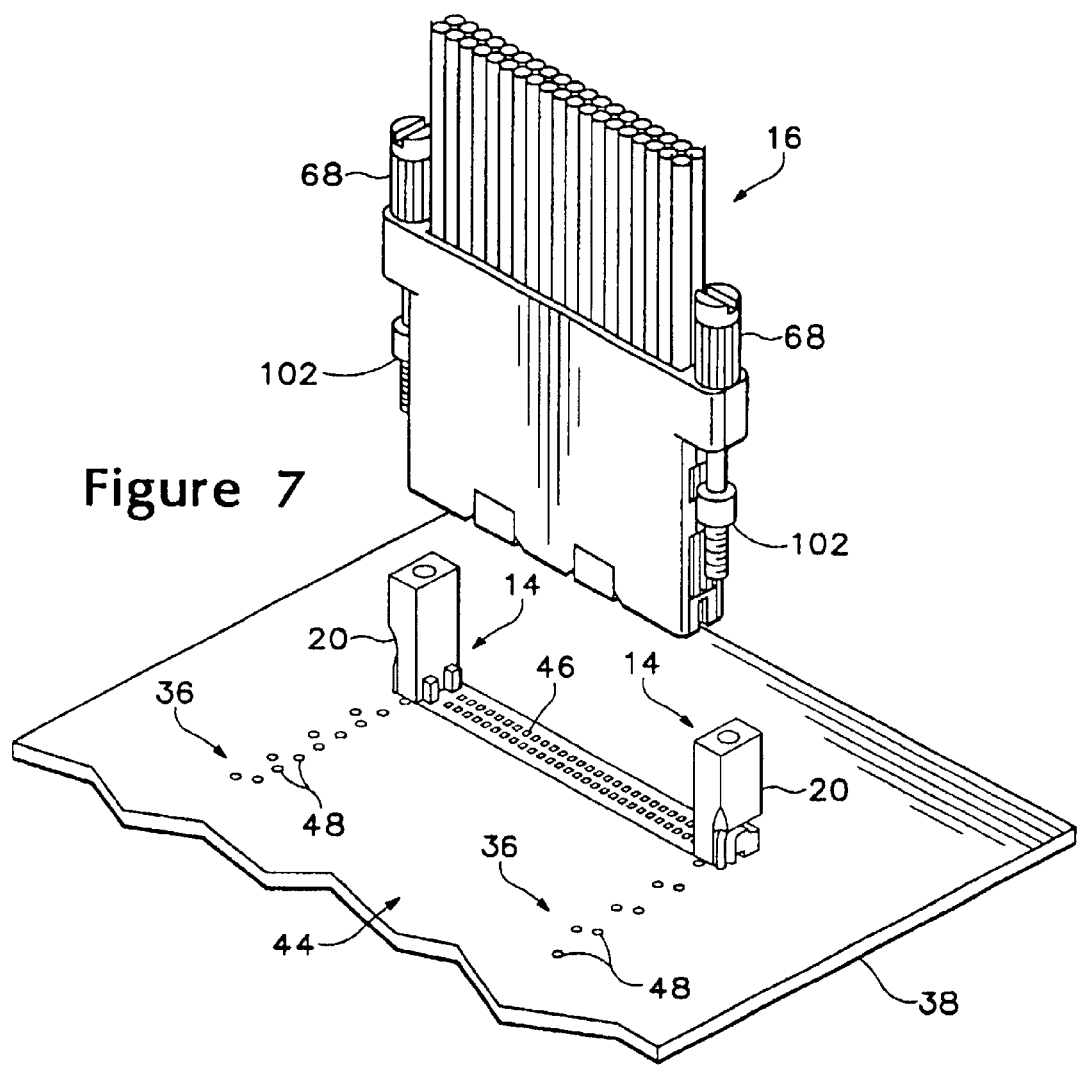
FIG. 7 is a perspective of the probing head positioned over the land pattern of the DUT.

The interface clip 66 is positioned over the open end 116 of the housing 70 and secured in place by the undercut 84 in the interface clip 66 engaging the ribs 85 on the inner surface of the housing 70 as shown in FIG. 6. The assembled probe head 60 is positioned over the land pattern 44 on the DUT 38 as shown in FIG. 7. The color coded mounting posts 20 and screws 68 provide for accurate orientation of the probe head 60 to the DUT 38. The probe head 60 is positioned between the two mounting posts 20 with the threaded portions 94 of the screws 68 engaging the threaded apertures 30 in the mounting posts 20. As the screws 68 are tightened into the mounting posts 20, the shoulder of the cap 96 engages the laterally extending protrusions 90 of the housing 70 and force the probing head 60 against the DUT 38. Continued tightening of the screws 68 brings the shoulders 102 of the bosses 100 into contact with the mounting posts 20 which prevents further tightening of the screws 68. The use of double shouldered screws 68 prevents the over tightening of the probe head 60 onto the DUT 38 which can damage the electrically conductive contacts 82 of the interface clip 66.

Figure 9:
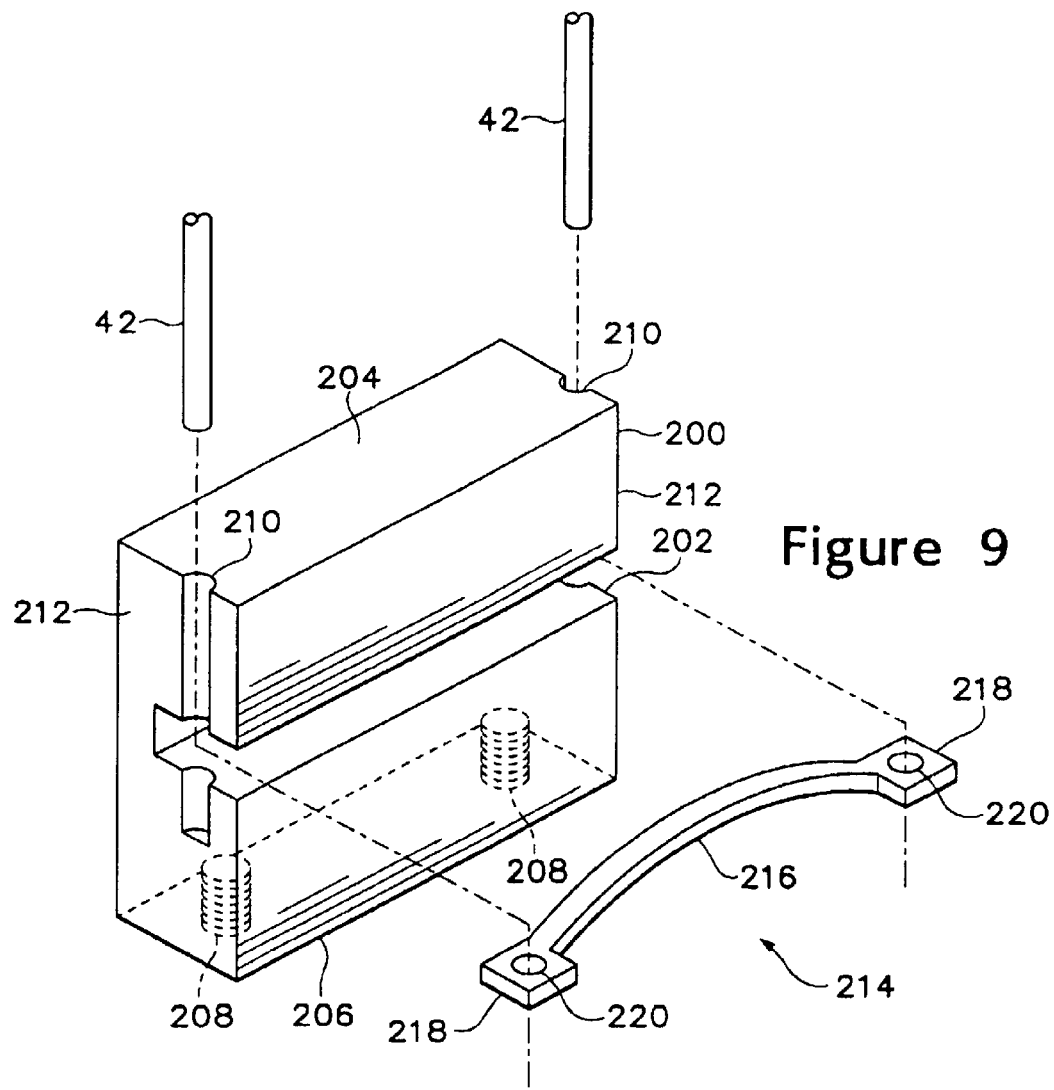
FIG. 9 is a perspective view of a modified mounting post usable for securing probe heads on opposing sides of a device under test.

The mounting posts 20 may be modified in the present invention to provide for "sandwich probing" where two probes 60 are mounted on opposite sides of a DUT circuit board 38 and mate with parallel rows of electrically conductive contacts 46 vertically aligned with each other on opposite sides of the DUT. Referring to FIG. 9, a modified mounting post 200 is shown that is mountable on the opposite side of the circuit board 38 below a set of mounting posts 20 previously secured to the other side of the circuit board 38. The mounting post 200 is formed of a substantially hard and durable material, preferably a metal such as aluminum. The mounting post 200 has a lateral slot 202 extending part way into the mounting post at a position between the base 204 and top 206 of the mounting post 200. The top 206 of the mounting post has a threaded aperture 208 for receiving the threaded screw ends 94 of the probe head mounting screws 68. Vertical slots 210 are formed in the sidewalls 212 of the mounting post 200 that extend past the lateral slot 202. A spring wire clip retention member 214 is disposed in the lateral slot 202 in the mounting post 200 and receives the ends of the spring wire clip 42 that secures the mounting post 20 on the opposite side of the circuit board 38. The spring wire retention member 214 has an arcuate center section 216 integrally formed with substantially rectangular portions 218 on each end. Each rectangular section 218 has an aperture 220 formed therein for receiving the respective ends of the spring wire clip 42. A portion of each aperture 220 of the spring wire retention member 214 extends into the vertical slots 210 on the opposing sides of the mounting post 200.

The modified mounting posts 200 are positioned on the carrier 18 as previously describe and positioned on the opposite side of the circuit board 38 from the previously secured mounting posts 20. The ends of the spring wire clip leads 42 are positioned along the vertical slots 210 in the mounting posts 200 and threaded through the apertures 220 in the spring wire clip retention members 214 that is positioned in the slots 212 in the modified mounting posts 200. The mounting posts 200 are then seated against the surface of the circuit board 38 and the spring wire clip leads 42 are soldered to the spring wire retention members 214. The carrier 18 is removed and the mounting posts 200 are in position to receive a probe head 60. The use of the modified mounting posts 200 allows two probe heads 60 to occupy the same footprint area on opposite sides of the DUT circuit board 38.

It will be obvious to those having skill in the art that many changes may be made to the details of the above-described embodiments of this invention without departing from the underlying principles thereof. The scope of the present invention should, therefore, be determined only by the following claims.

What is claimed is:

1. A high density logic analyzer probing system for a device under test having opposing surfaces with one surface having a land pattern that includes electrically conductive contacts disposed between mounting holes formed in the device under test comprising:

a removable probe mounting fixture having a handle and a mounting post alignment portion;

mounting posts having a threaded aperture formed in a first surface thereof positioned adjacent to the ends of the mounting post alignment portions and held in place by downwardly extending studs in the handle portion engaging the threaded apertures in the mounting posts with one of the mounting posts having an alignment stud extending from a second surface opposite the first surface for engaging an alignment hole in the device under test;

mounting post securing members engaging the mounting posts and positioned through and secured in the mounting holes in the device under test with the removable probe mounting fixture being removed from the mounting posts;

a probe head having electrically conductive contacts disposed at one end of a housing engaging the electrically conductive contacts on the device under test with the housing having laterally extending protrusions formed on the opposite end of the housing for receiving mounting screws; and each mounting screw having a shaft and a threaded portion at one end and a integrally form cap at the other end forming a first shoulder on the shaft and a boss disposed between the threaded portion and the cap having a second shoulder;

wherein the threaded portions of the screws engage the respective threaded aperture of the mounting posts with the first shoulder providing downward force on the probe against the device under test as the screws are tightened in the mounting posts and the second shoulder providing a positive stop for the probe head as the screws are tightened to prevent excess force between the probe head and the device under test.

2. The high density logic analyzer probing system as recited in claim 1 wherein the mounting post securing members comprise spring wire clips with each spring wire clip having a central portion and end portions, the central portion of each wire clip disposed in a recess formed in a side surface of each mounting post with the end portions of each spring wire clip extending below the mounting posts.

3. The high density logic analyzer probing system as recited in claim 2 wherein the opposing surface of the device under test has electrically conductive contacts vertically aligned with the electrically conductive contacts on the other surface and the high density logic analyzer probing system further comprising modified mounting posts positioned on the opposing surface of the device under test with each modified mounting post having a threaded aperture formed in a top surface thereof and a lateral slot formed in a side surface Intersecting vertical slots formed in adjacent side surfaces with the lateral slot receiving a spring wire clip retention member having end portions separated by a central portion with each end portion having an aperture therein, the end portions of the spring wire clips from the mounting posts on the other surface of the device under test extending along the vertical slots in the modified mounting posts and through the apertures in the end portions of the spring wire clip retention members with the end portions of the spring wire clips being secured to the end portions of the spring wire clip retention members.

* * * * *